United States Patent
Yu et al.

(10) Patent No.: US 8,143,114 B2
(45) Date of Patent: Mar. 27, 2012

(54) SYSTEM AND METHOD FOR SOURCE/DRAIN CONTACT PROCESSING

(75) Inventors: Chen-Hua Yu, Hsin-Chu (TW);
Cheng-Hung Chang, Hsin-Chu (TW);
Chen-Nan Yeh, Hsi-Chih (TW);
Yu-Rung Hsu, Tainan (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/027,436

(22) Filed: Feb. 15, 2011

(65) Prior Publication Data
US 2011/0171805 A1 Jul. 14, 2011

Related U.S. Application Data

(63) Continuation of application No. 11/872,546, filed on Oct. 15, 2007, now Pat. No. 7,910,994.

(51) Int. Cl.
*H01L 21/00* (2006.01)
*H01L 21/84* (2006.01)
(52) U.S. Cl. .................. 438/149; 438/479; 438/523
(58) Field of Classification Search .......... 438/149–161, 438/479, 517–524, E29.147
See application file for complete search history.

(56) References Cited

U.S. PATENT DOCUMENTS

| 6,706,571 | B1 | 3/2004 | Yu et al. |
| 6,858,478 | B2 | 2/2005 | Chau et al. |
| 6,867,433 | B2 | 3/2005 | Yeo et al. |
| 6,888,252 | B2 | 5/2005 | Derraa |
| 6,913,960 | B2 | 7/2005 | Bryant et al. |
| 7,105,894 | B2 | 9/2006 | Yeo et al. |
| 7,190,050 | B2 | 3/2007 | King et al. |
| 7,247,887 | B2 | 7/2007 | King et al. |
| 7,262,086 | B2 | 8/2007 | Yeo et al. |
| 7,265,008 | B2 | 9/2007 | King et al. |
| 7,508,031 | B2 | 3/2009 | Liu et al. |
| 7,528,465 | B2 | 5/2009 | King et al. |
| 7,605,449 | B2 | 10/2009 | Liu et al. |
| 7,851,276 | B2 * | 12/2010 | Yang et al. .................. 438/149 |
| 7,888,201 | B2 * | 2/2011 | Yeo et al. .................. 438/238 |
| 2005/0153490 | A1 | 7/2005 | Yoon et al. |
| 2006/0157749 | A1 | 7/2006 | Okuno |

(Continued)

FOREIGN PATENT DOCUMENTS

CN 1525530 A 9/2004

OTHER PUBLICATIONS

Chen, C-H., et al., "Stress Memorization Technique (SMT) By Selectively Strained-Nitride Capping for Sub-65nm High-Performance Strained-Si Device Application," 2004 Symposium on VLSI Technology Digest of Technical Papers, IEEE, pp. 56-57.

(Continued)

*Primary Examiner* — Cuong Q Nguyen
(74) *Attorney, Agent, or Firm* — Slater & Matsil, L.L.P.

(57) ABSTRACT

System and method for reducing contact resistance and prevent variations due to misalignment of contacts is disclosed. A preferred embodiment comprises a non-planar transistor with source/drain regions located within a fin. An inter-layer dielectric overlies the non-planar transistor, and contacts are formed to the source/drain region through the inter-layer dielectric. The contacts preferably come into contact with multiple surfaces of the fin so as to increase the contact area between the contacts and the fin.

20 Claims, 6 Drawing Sheets

U.S. PATENT DOCUMENTS

| | | | |
|---|---|---|---|
| 2007/0120156 A1 | 5/2007 | Liu et al. | |
| 2007/0122953 A1 | 5/2007 | Liu et al. | |
| 2007/0122954 A1 | 5/2007 | Liu et al. | |
| 2007/0128782 A1 | 6/2007 | Liu et al. | |
| 2007/0132053 A1 | 6/2007 | King et al. | |
| 2008/0290470 A1 | 11/2008 | King et al. | |
| 2008/0296632 A1 | 12/2008 | Moroz et al. | |
| 2009/0181477 A1 | 7/2009 | King et al. | |
| 2011/0223735 A1* | 9/2011 | Yu et al. | 438/299 |

OTHER PUBLICATIONS

Knoch, J., et al., "Schottky-Barrier Height Tuning Using Dopant Segregation in Schottky-Barrier MOSFETs on Fully-Depleted SOI," Mater. Res. Soc. Symp. Proc., vol. 913, Materials Research Society, 2006, 0913-D01-07, 6 pages.

Lin, H.-C., et al., "High-Performance P-Channel Schottky-Barrier SOI FinFET Featuring Self-Aligned PtSi Source/Drain and Electrical Junctions," IEEE Electron Device Letters, vol. 24, No. 2, Feb. 2003, pp. 102-104.

Yagishita, A., et al., "Schottky Barrier Height Reduction and Drive Current Improvement in Metal Source/Drain MOSFET with Strained-Si Channel," Japenese Journal of Applied Physics, vol. 43, No. 4B, 2004, pp. 1713-1716.

Chinese Office Action dated Jun. 2, 2010, 5 pages.

* cited by examiner

SYSTEM AND METHOD FOR SOURCE/DRAIN CONTACT PROCESSING

This application is a continuation of U.S. patent application Ser. No. 11/872,546, entitled "System and Method for Source/Drain Contact Processing", filed Oct. 15, 2007, which application is incorporated herein by reference.

TECHNICAL FIELD

The present invention relates generally to a system and method for forming electrical contacts, and more particularly to a system and method for forming electrical contacts to sections raised above a substrate.

BACKGROUND

In the race to improve transistor performance as well as reduce the size of transistors, transistors have been developed that do not follow the traditional planar format, such that the source/drain regions are not located in the substrate, but rather are non-planar transistors where the source/drain regions are located in a fin above the substrate. One such non-planar device is a multiple-gate FinFET. In its simplest form, a multiple-gate FinFET has a gate electrode that straddles across a fin-like silicon body to form a channel region. There are two gates, one on each sidewall of the silicon fin. The source/drain regions are located in the fin, away from the substrate.

Electrical contacts to the source/drain regions have traditionally followed a layout rule such that the contact is formed to connect to a portion of the top of the fin-like silicon body. Accordingly, from this layout rule, the contact width has been either less than, or at most equal to, the width of the fin. For example, in a device where the contact width is 60 nm, the width of the device would necessarily be either greater than or equal to 60 nm. In cases where the contact has necessarily exceeded the width of the fin in the channel region (for example, when the FinFET width is less than 60 nm), the width of the fin in the source and drain regions has been enlarged so that the width of the fin in these regions is larger than the width of the contact.

However, by adhering to this layout rule, a number of problems have arisen. One such problem is that, with the reduction of the contact area, the contact resistance of the contact has risen, thereby limiting improvements to the driving current of the device. Also, mis-alignment of the contacts during the manufacturing process has led to variations in the contact resistance between the device and the contacts, thereby leading to differences in resistance between various devices and reducing the overall circuit yield. Additionally, silicide formation is usually performed with an ultra shallow junction on the source/drain areas, thereby preventing improvements in the Schottky barrier height.

Accordingly, what is needed is a new contact design that allows for a reduced contact resistance while also reducing mis-alignment of the contacts during formation.

SUMMARY OF THE INVENTION

These and other problems are generally solved or circumvented, and technical advantages are generally achieved, by preferred embodiments of the present invention which provide a structure and method for forming contacts to the source/drain regions of a non-planar semiconductor device.

One aspect of the present invention includes a semiconductor device that comprises a non-planar transistor having source/drain regions located in a fin raised above the substrate. An inter-layer dielectric is located over the non-planar transistor, and contacts extend through the inter-layer dielectric to make contact with multiple surfaces of the fin.

Another aspect of the present invention includes a semiconductor device that comprises a substrate and a conductive region that extends above the substrate. A dielectric layer is located over the conductive region, and a contact extends through the dielectric layer to contact the top surface of the conductive region and at least two sidewalls of the conductive region.

Another aspect of the present invention includes a semiconductor device that comprises a substrate and a fin raised above the substrate. An inter-layer dielectric is located over the fin, and at least one contact is located through the inter-layer dielectric and is connected to a plurality of surfaces of the fin.

Another aspect of the present invention includes a method for forming a semiconductor device comprising forming a non-planar transistor on a substrate, the non-planar transistor comprising a fin with source/drain regions formed therein, the fin comprising a top surface and sidewalls. An inter-layer dielectric is formed over the non-planar transistor, the inter-layer dielectric having a maximum height, and an opening is formed only partially through the maximum height of the inter-layer dielectric so as to expose at least a portion of the top surface and at least a portion of the sidewalls of the fin. The opening is filled with a conductive material to form a contact with one of the source/drain regions, the contact in connection with the top surface and sidewalls of the fin.

Another aspect of the present invention includes a method for forming a semiconductor device comprising forming a conductive region over a substrate, the conductive region comprising a first region with a first lattice constant, a second region with a second lattice constant different from the first lattice constant, and a third region opposite the second region from the first region, the third region having the first lattice constant. An inter-layer dielectric is formed over the conductive region and an opening is formed through the inter-layer dielectric to expose at least three surfaces of the conductive region, the at least three surfaces forming an exposed conductive region. The opening is filled with a conductive material to form a contact with the exposed conductive region.

Another aspect of the present invention includes a method of forming a semiconductor device comprising forming a conductive region over a substrate, the conductive region comprising an upper surface and sidewalls, the sidewalls having a first height, the conductive region also comprising a first section, a second section, and a third section interposed between the first section and the second section. An inter-layer dielectric is formed over the conductive region and at least one aperture is formed through the inter-layer dielectric to expose at least a portion of the upper surface and at least a portion of the sidewalls, the forming the at least one aperture only exposing a portion of the first height of the sidewalls. The at least one aperture is filled with a conductive material to form at least one contact to the conductive region, the at least one contact being in physical connection with the upper surface and at least a portion of two or more of the sidewalls.

An advantage of a preferred embodiment of the present invention is a reduction in the contact resistance between the source/drain regions and the contacts, which leads to greater overall device performance. Further, variations in the contact resistances because of contact misalignment is also reduced, creating a more uniform product, and the silicide formation does not require an ultra shallow junction, allowing further improvements in the Schottky barrier height.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a FinFet transistor. The invention may also be applied, however, to other semiconductor devices, particularly non-planar devices. For example, embodiments of the present invention may be utilized with non-planar resistors, diodes, capacitors, fuses and the like.

Figure 1:
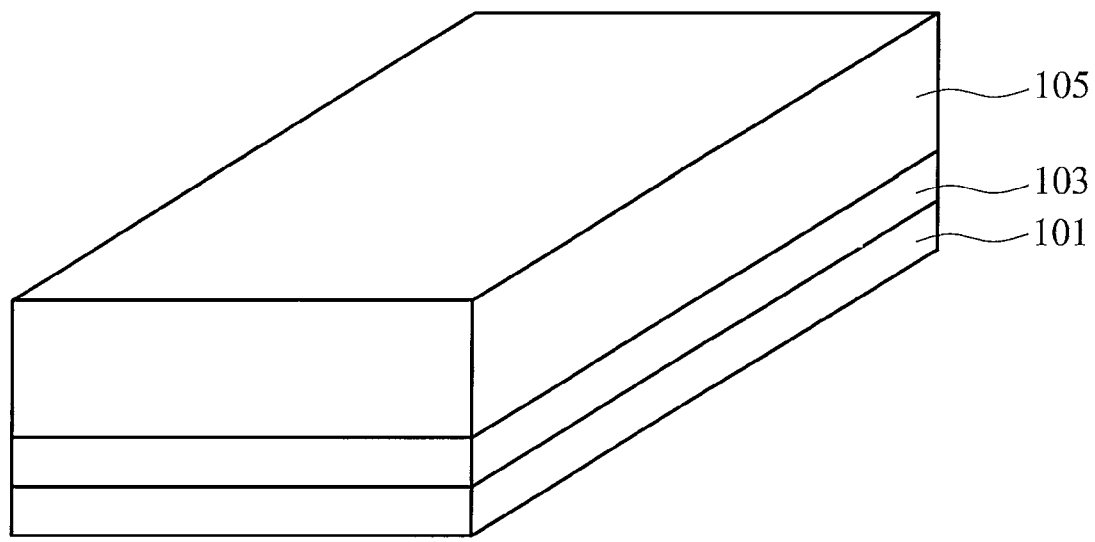
FIGS. 1-8 illustrate intermediate steps in the formation of contacts in accordance with an embodiment of the present invention.

With reference now to FIG. 1, there is shown a preferred semiconductor-on-insulator (SOI) substrate, although other substrates, such as bulk silicon, strained SOI, and silicon germanium on insulator, could alternatively be used. The preferred semiconductor-on-insulator substrate includes a substrate 101, an insulator layer 103, and a semiconductor layer 105. The substrate 101 is preferably silicon.

The insulator layer 103 may be formed from any dielectric or insulator, and is preferably comprised of silicon oxide or silicon nitride or a structured combination of both. The insulator layer 103 may have a thickness in the range of about 100 angstroms to about 3,000 angstroms, although it is understood that thinner or thicker thicknesses may be used.

The semiconductor layer 105 may be formed from an elemental semiconductor such as silicon, an alloy semiconductor such as silicon-germanium, or a compound semiconductor such as gallium arsenide or indium phosphide. The semiconductor layer 105 is preferably silicon. The thickness of the semiconductor layer 105 may be in the range of about 200 angstroms to about 5,000 angstroms. In an alternate embodiment, bulk semiconductor substrates such as a bulk silicon substrate may also be used. Preferably, the substrate semiconductor layer 105 is a p-type semiconductor, although in other embodiments, it could be an n-type semiconductor.

Figure 2:
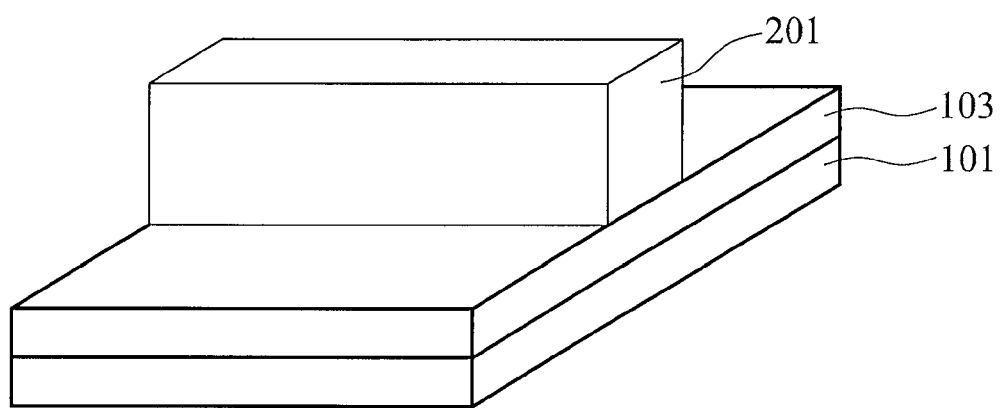

FIG. 2 illustrates the formation of a fin 201 from the semiconductor layer 105. The fin 201 may be formed by depositing a mask material (not shown) such as a photoresist material and/or a hardmask over the semiconductor layer 105. The mask material is then patterned and the semiconductor layer 105 is etched in accordance with the pattern forming the fin 201 as illustrated in FIG. 2.

Figure 3:
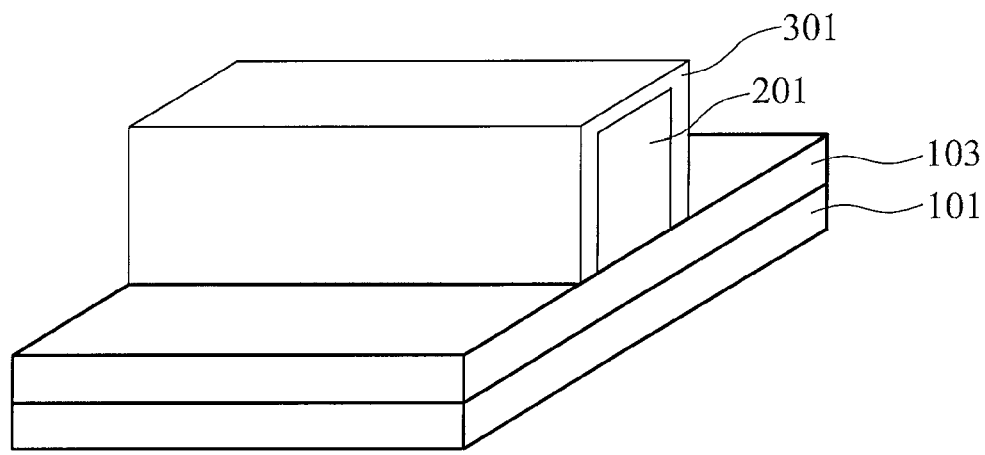

FIG. 3 illustrates the formation of a gate dielectric layer 301 over the fin 201. The gate dielectric layer 301 may be formed by thermal oxidation, chemical vapor deposition, sputtering, or any other methods known and used in the art for forming a gate dielectric. Depending on the technique of gate dielectric formation, the gate dielectric 301 thickness on the top of the fin 201 may be different from the gate dielectric thickness on the sidewall of the fin 201.

The gate dielectric 301 may comprise a material such as silicon dioxide or silicon oxynitride with a thickness ranging from about 3 angstroms to about 100 angstroms, preferably less than about 10 angstroms. The gate dielectric 301 may alternatively be formed from a high permittivity (high-k) material (e.g., with a relative permittivity greater than about 5) such as lanthanum oxide ($La_2O_3$), aluminum oxide ($Al_2O_3$), hafnium oxide ($HfO_2$), hafnium oxynitride (HfON), or zirconium oxide ($ZrO_2$), or combinations thereof, with an equivalent oxide thickness of about 3 angstroms to about 100 angstroms, and preferably 10 angstroms or less.

Figure 4:
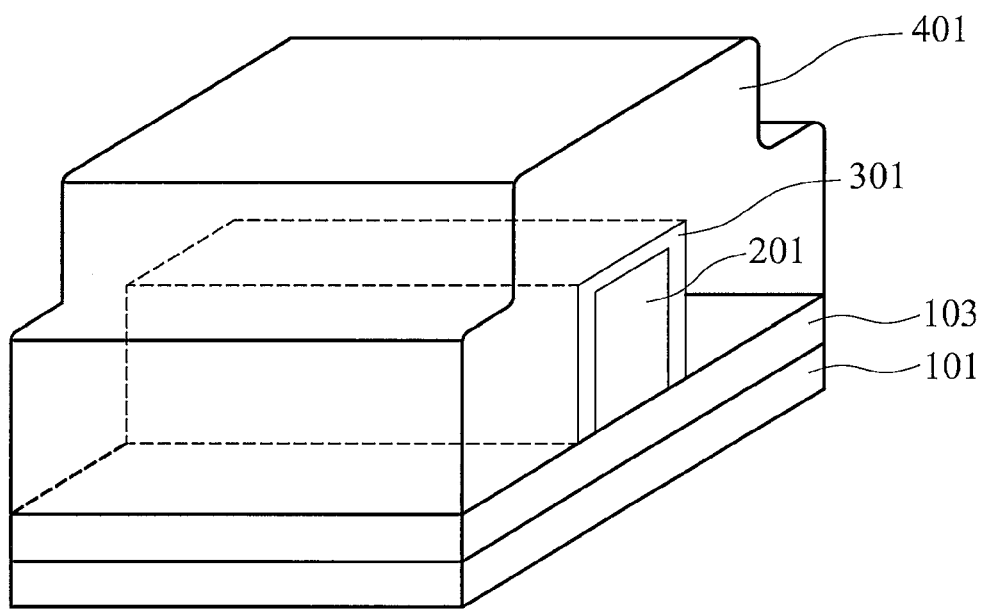

FIG. 4 illustrates the formation of gate electrode layer 401. The gate electrode layer 401 comprises a conductive material and may be selected from a group comprising of polycrystalline-silicon (poly-Si), poly-crystalline silicon-germanium (poly-SiGe), metallic nitrides, metallic silicides, metallic oxides, and metals. Examples of metallic nitrides include tungsten nitride, molybdenum nitride, titanium nitride, and tantalum nitride, or their combinations. Examples of metallic silicide include tungsten silicide, titanium silicide, cobalt silicide, nickel silicide, platinum silicide, erbium silicide, or their combinations. Examples of metallic oxides include ruthenium oxide, indium tin oxide, or their combinations. Examples of metal include tungsten, titanium, aluminum, copper, molybdenum, nickel, platinum, etc.

The gate electrode layer 401 may be deposited by chemical vapor deposition (CVD), sputter deposition, or other techniques known and used in the art for depositing conductive materials. The thickness of the gate electrode layer 401 may be in the range of about 200 angstroms to about 4,000 angstroms. The top surface of the gate electrode layer 401 usually has a non-planar top surface, and may be planarized prior to patterning of the gate electrode layer 401 or gate etch. Ions may or may not be introduced into the gate electrode layer 401 at this point. Ions may be introduced, for example, by ion implantation techniques.

Figure 5:
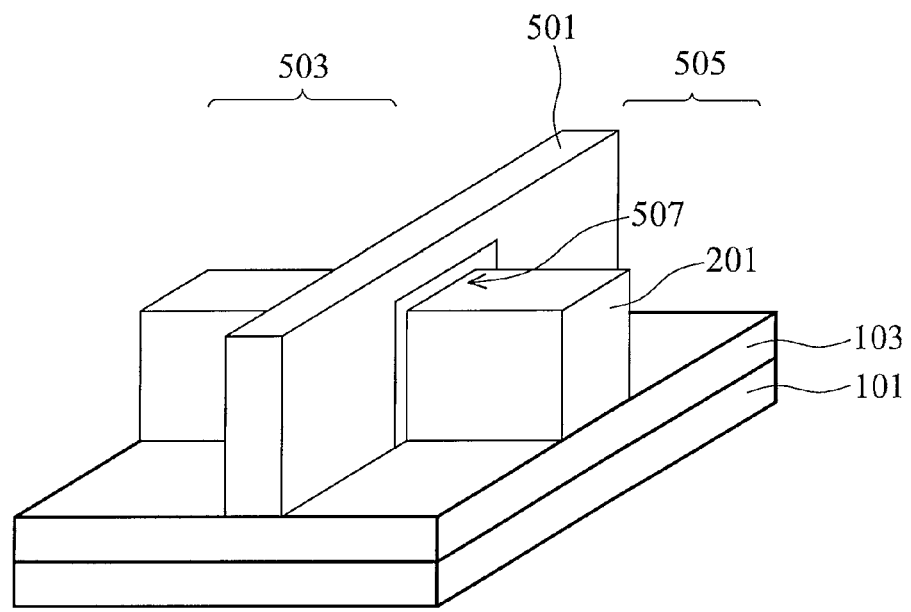

FIG. 5 illustrates the patterning of the gate dielectric 301 and the gate electrode layer 401 to form a gate stack 501 and define a first section of the fin 503, a second section of the fin 505, and a channel region 507 located in the fin 201 underneath the gate dielectric 301. The gate stack 501 may be formed by depositing and patterning a gate mask (not shown) on the gate electrode layer 401 (see FIG. 4) using, for example, deposition and photolithography techniques known in the art. The gate mask may incorporate commonly used masking materials, such as (but not limited to) photoresist material, silicon oxide, silicon oxynitride, and/or silicon nitride. The gate electrode layer 401 and the gate dielectric layer 301 may be etched using plasma etching to form the patterned gate stack 501 as illustrated in FIG. 5.

Figure 6:
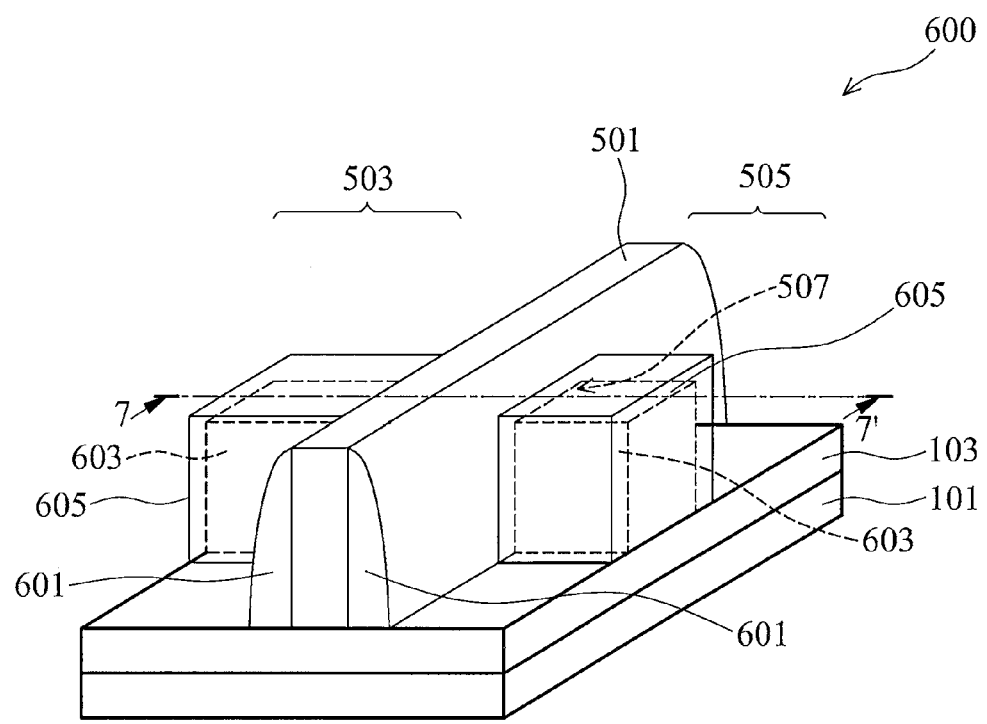

FIG. 6 illustrates the completion of the device 600 through the formation of spacers 601, source/drain regions 603, and silicide contacts 605. The spacers 601 may be formed on opposing sides of the gate stack 501. The spacers 601 are typically formed by blanket depositing a spacer layer (not shown) on the previously formed structure. The spacer layer preferably comprises SiN, oxynitride, SiC, SiON, oxide, and the like and is preferably formed by methods utilized to form such a layer, such as chemical vapor deposition (CVD), plasma enhanced CVD, sputter, and other methods known in the art. The spacers 601 are then patterned, preferably by anisotropically etching to remove the spacer layer from the horizontal surfaces of the structure.

Source/drain regions 603 are formed in the first section of the fin 503 and the second section of the fin 505 by implanting appropriate dopants to complement the dopants in the fin 201. For example, p-type dopants such as boron, gallium, indium, or the like may be implanted to form a PMOS device. Alternatively, n-type dopants such as phosphorous, arsenic, antimony, or the like may be implanted to form an NMOS device. These source/drain regions 603 are implanted using the gate stack 501 and the gate spacers 601 as masks. It should be noted that one of ordinary skill in the art will realize that many other processes, steps, or the like may be used to form these source/drain regions 603. For example, one of ordinary skill in the art will realize that a plurality of implants may be performed using various combinations of spacers and liners to form source/drain regions having a specific shape or characteristic suitable for a particular purpose. Any of these processes may be used to form the source/drain regions 603, and the above description is not meant to limit the present invention to the steps presented above.

In a preferred embodiment the source/drain regions 603 may be formed so as to reduce the Schottky barrier height of subsequent contacts (discussed below with respect to FIGS. 9A-B and 10A-B) with the source/drain regions 603. For example, the dopants for the source/drain regions 603 may be implanted through a segregated doping method. Alternatively, an ultrathin insulator layer (not shown) may be formed over the source/drain regions 603 and the dopants may be implanted through the ultrathin insulator layer.

In another embodiment the source/drain regions 603 are formed so as to impart a strain on the channel region 507. In this embodiment, the first section 503 of the fin 201 and the second section 505 of the fin 201 are removed through a process such as a wet etch. The first section 503 and the second section 505 may then be regrown to form a stressor that will impart a stress to the channel region 507 of the fin 201 located underneath the gate stack 501. In a preferred embodiment wherein the fin 201 comprises silicon, the first section 503 of the fin 201 and the second section 505 of the fin 201 are etched while using the gate stack 501 or spacers 601 to prevent etching of the channel region 507. After removal of the first section 503 of the fin 201 and the second section 505 of the fin 201, these sections may then be regrown through a selective epitaxial process with a material, such as silicon germanium, that has a different lattice constant than the silicon. The lattice mismatch between the stressor material in the source and drain regions 603 and the channel region 507 will impart a stress into the channel region 507 that will increase the carrier mobility and the overall performance of the device. The source/drain regions 603 may be doped either through an implantation method as discussed above, or else by in-situ doping as the material is grown.

After the source/drain regions 603 have been formed, an optional silicide process can be used to form silicide contacts 605 along one or more of the top and sidewalls of the fin 201 over the source and drain regions 603. The silicide contacts 605 preferably comprise nickel, cobalt, platinum, or erbium in order to reduce the Schottky barrier height of the contact. However, other commonly used metals, such as titanium, palladium, and the like, may also be used. As is known in the art, the silicidation may be performed by blanket deposition of an appropriate metal layer, followed by an annealing step which causes the metal to react with the underlying exposed silicon. Un-reacted metal is then removed, preferably with a selective etch process. The thickness of the silicide contacts 605 is preferably between about 5 nm and about 50 nm.

Alternatively, instead of silicide contacts, a metal layer (not shown) may be formed along one or more of the top and sidewalls of the fin 201 over the source and drain regions 603. The metal layer preferably comprises aluminum, nickel, copper, or tungsten in order to lower the Schottky barrier height of the contact.

Figure 7:
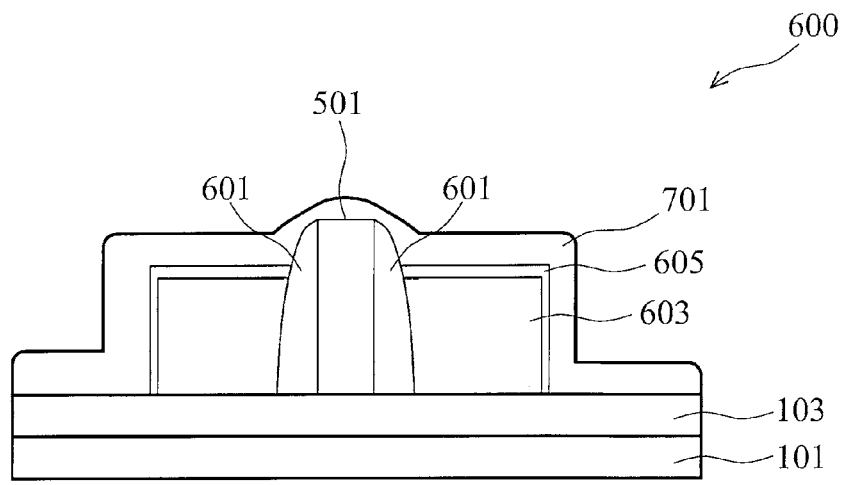

FIG. 7 is a cross sectional view of the structure of FIG. 6 taken along the 7-7' line and which illustrates an optional contact etch stop layer (CESL) 701 formed over the device 600 for protection during subsequent process steps. The CESL 701 may also be used as a stressor to form a stress in the channel region 507 of the device 600. The CESL 701 is preferably formed of silicon nitride, although other materials, such as nitride, oxynitride, boron nitride, combinations thereof, or the like, may alternatively be used. The CESL 701 may be formed through chemical vapor deposition (CVD) to a thickness of between about 20 nm and about 200 nm, with a preferred thickness of about 80 nm. However, other methods of formation may alternatively be used. Preferably, the CESL 701 imparts a tensile strain to the channel region 507 of the fin 201 for an NMOS device and imparts a compressive strain to the channel region 507 of the fin 201 for a PMOS device.

Figure 8:
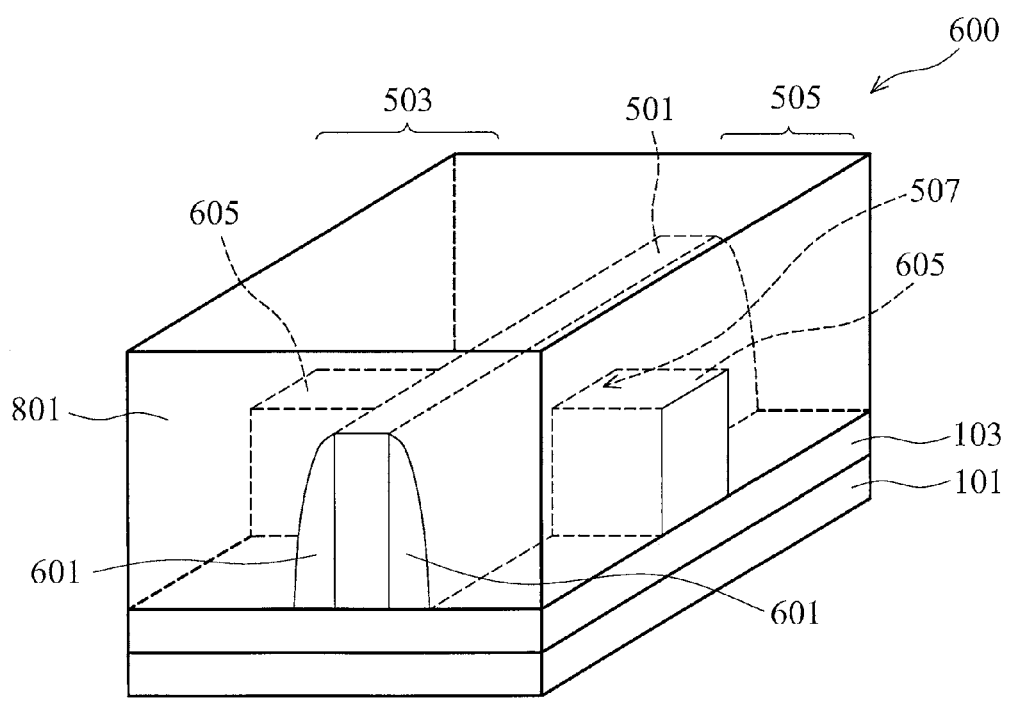

FIG. 8 illustrates the formation of an inter-layer dielectric (ILD) 801 over the device 600. For the sake of clarity the CESL 701 illustrated in FIG. 7 is not shown, and the silicide contacts 605 and source/drain regions 603 have been merged into one area shown as the silicide contacts 605. The ILD 801 may be formed by chemical vapor deposition, sputtering, or any other methods known and used in the art for forming an ILD 801. The ILD 801 typically has a planarized surface and may be comprised of silicon oxide, although other materials, such as high-k materials, could alternatively be utilized. Preferably, the ILD 801 is formed so as to impart a strain to the channel region 507 of the fin 201, which will increase the overall performance of the device 600.

Figure 9A:
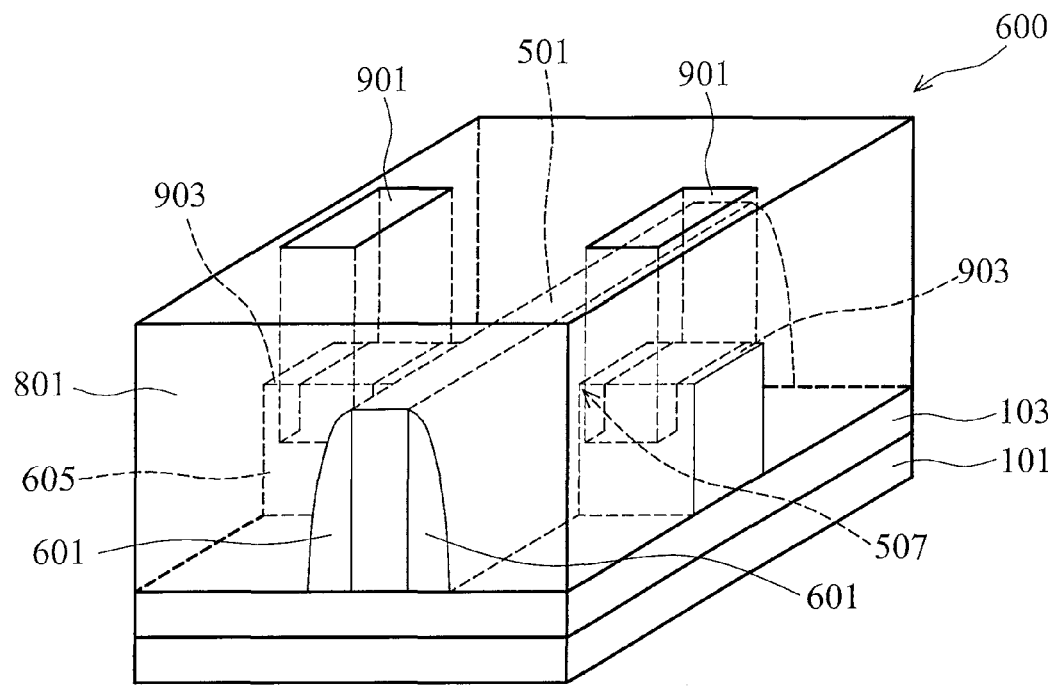
FIG. 9 and FIG. 9A are a perspective view and a top-down view, respectively, of contacts made to multiple surfaces of a fin containing source/drain regions in accordance with an embodiment of the present invention.

FIG. 9A illustrates the formation of contacts 901 through the ILD 801 to the silicide contacts 605. Contacts 901 may be formed in the ILD 801 in accordance with known photolithography and etching techniques. Generally, photolithography techniques involve depositing a photoresist material, which is masked, exposed, and developed to expose portions of the ILD 801 that are to be removed. The remaining photoresist material protects the underlying material from subsequent processing steps, such as etching. In the preferred embodiment photoresist material is utilized to create a patterned mask to define contacts 901. The mask is patterned to subsequently form openings that are wider than the width of the fin 201. Additional masks, such as a hardmask, may also be used.

The etching process may be an anisotropic or isotropic etch process, but preferably is an anisotropic dry etch process. In a preferred embodiment, the etch process is continued until an upper surface 903 of the fin 201 containing the source/drain regions 603 and at least a portion of the sidewalls of the fin 201 are exposed, thereby exposing at least three surfaces of the fin 201 (portions of the top surface and portions of at least two sidewalls).

Contacts 901 are then formed so as to contact the exposed surfaces of the fin 201. In this embodiment each contact 901 is formed so as to be in contact with multiple surfaces of the fin 201. In a preferred embodiment the contacts 901 are formed so as to be in contact with at least three surfaces of the fin 201, although a larger or smaller number of surfaces could alternatively be contacted. This allows for a larger area of contact between the silicide contacts 605 and the contact 901 than contacts that only contact the top surface of the fin 201. Accordingly, the contact resistance of the device may be reduced. This embodiment also has the advantage of reducing variations in the contact resistances due to mis-alignments of the contacts 901, since there is more leeway for variation when the width of the contacts 901 are larger than the width of the fin 201.

The contacts 901 may comprise a barrier/adhesion layer (not shown) to prevent diffusion and provide better adhesion between the contacts 901 and the ILD 801. In an embodiment, the barrier layer is formed of one or more layers of titanium, titanium nitride, tantalum, tantalum nitride, or the like. The barrier layer is preferably formed through chemical vapor deposition, although other techniques could alternatively be used. The barrier layer is preferably formed to a combined thickness of about 50Å to about 500 Å.

The contacts 901 may be formed of any suitable conductive material, such as a highly-conductive, low-resistive metal, elemental metal, transition metal, or the like. In an exemplary embodiment the contacts 901 are formed of tungsten, although other materials, such as copper, could alternatively be utilized. In an embodiment in which the contacts 901 are formed of tungsten, the contacts 901 may be deposited by CVD techniques known in the art, although any method of formation could alternatively be used.

Figure 9B:
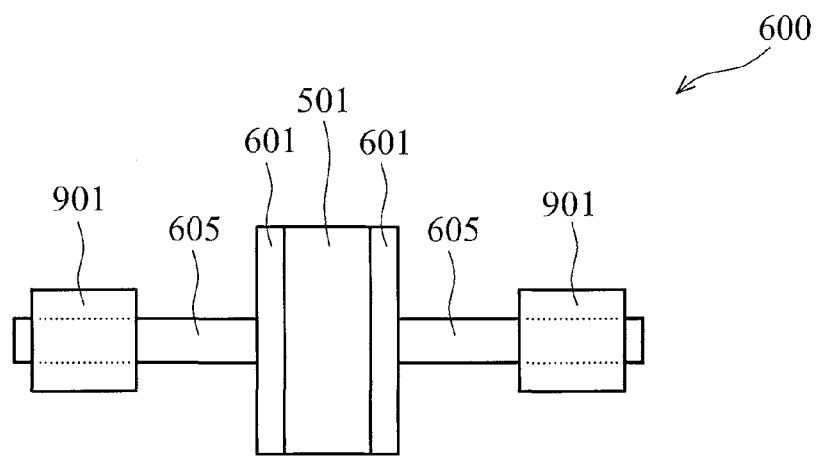

FIG. 9B illustrates a top-down view of the device 600 formed by the process described above with reference to FIG. 8A. As noted, in this embodiment, the contacts 901 are formed to have a larger contact area than previous contacts. Further, the width of the fin 201 at the area of contact may be smaller than the contacts 901, and the fin 201 does not have to be widened in the area of the contacts 901 in order to meet design rules.

Figure 10A:
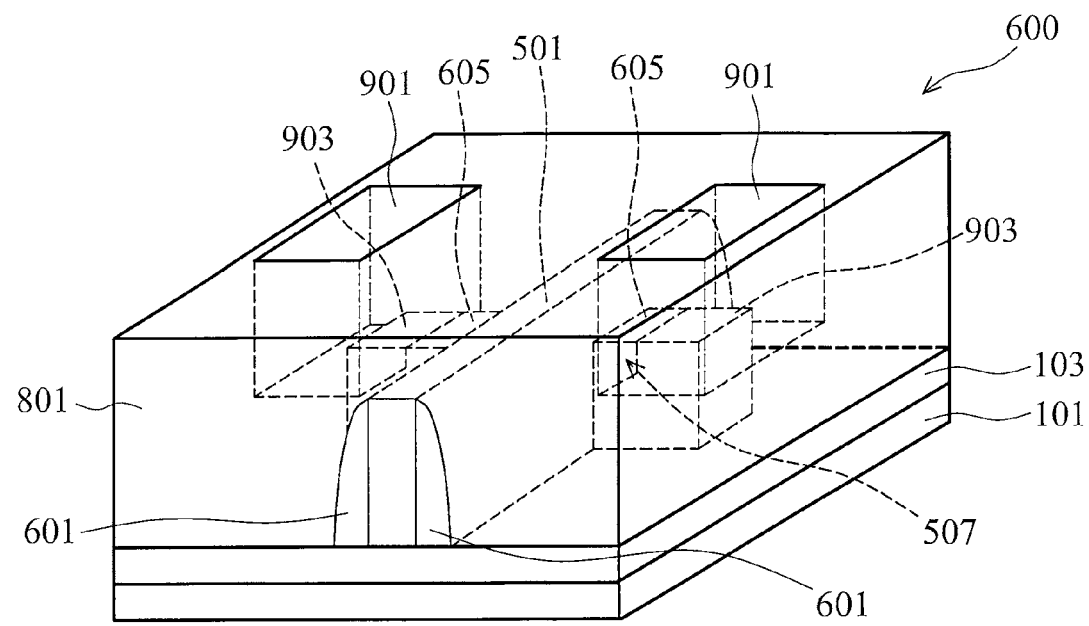
FIG. 10A and FIG. 10B are a perspective view and a top-down view, respectively, of contacts made to an upper surface and three sidewalls of a fin containing source/drain regions in accordance with an embodiment of the present invention.

FIG. 10A illustrates another embodiment in which the contacts 901 are in connection with multiple sides of the fin 201. However, in this embodiment, the contacts 901 are formed so as to contact not only the top of the fin 201 and at least two of the sidewalls of the fin 201, but connect to the top of the fin 201 and at least three of the sidewalls of the fin 201. In this embodiment the etch used to form the openings for the contacts 901 continues beyond the upper surface 903 of the fin 201 until at least a portion of three sidewalls of the fin 201 are substantially exposed, and potentially until at least a portion of the insulator layer 104 has also been substantially exposed. Accordingly, when the material for the contacts 901 is deposited or else formed in the openings, the contact 901 will be formed in connection with at least four surfaces of the fin 201, including the top of the fin 201 and at least three of the sidewalls of the fin 201.

Figure 10B:
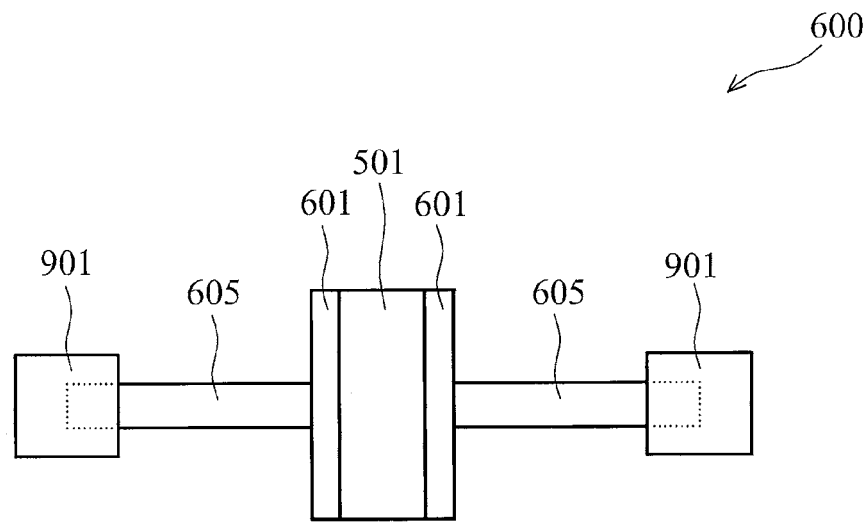

FIG. 10B illustrates a top-down view of the embodiment described above with respect to FIG. 10A. As previously indicated, the contacts 901 are in connection with at least four surfaces of the fin 201, which allows for a larger contact area between the contacts 901 and the silicide contacts 605. This larger contact area would allow for a reduction of the width of the fin 201 while preventing a subsequent rise in the contact resistance due to a reduced contact area.

In a preferred embodiment of the present invention, the multi-sided contacts 901 are preferably formed on a device 600 that comprises either a strained channel region or a reduced Schottky barrier height between the source/drain regions 603 and the contacts 901, or both. Preferably, the Schottky barrier height may be reduced through the methods described above with reference to FIG. 6. The strained channel may be formed through a suitable strained process, preferably including one or more of the strained processes described above. These processes preferably include SiGe Source/Drain epitaxial growth (described above with respect to FIG. 6), CESL (described above with respect to FIG. 7), and ILD (described above with respect to 8).

Although the present invention and its advantages have been described in detail, it should be understood that various changes, substitutions and alterations can be made herein without departing from the spirit and scope of the invention as defined by the appended claims. For example, there are multiple methods for the deposition of material as the structure is being formed. Any of these deposition methods that achieve substantially the same result as the corresponding embodiments described herein may be utilized according to the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for forming a semiconductor device, the method comprising:
   forming a non-planar transistor on a substrate, the non-planar transistor comprising a fin with source/drain regions formed therein, the fin comprising a top surface and sidewalls;
   forming an inter-layer dielectric over the non-planar transistor, the inter-layer dielectric having a maximum height;
   forming an opening only partially through the maximum height of the inter-layer dielectric so as to expose at least a portion of the top surface and at least a portion of the sidewalls of the fin; and
   filling the opening with a conductive material to form a contact with one of the source/drain regions, the contact in connection with the top surface and sidewalls of the fin.

2. The method of claim 1, wherein forming an opening includes exposing a portion of at least two sidewalls.

3. The method of claim 1, wherein forming an opening includes exposing a portion of at least three sidewalls.

4. The method of claim 1, wherein the inter-layer dielectric imparts a stress to the area of the fin between the source/drain regions.

5. The method of claim 1, further comprising forming a contact etch stop layer over the non-planar transistor prior to forming an inter-layer dielectric, the contact etch stop layer imparting a stress to an area of the fin between the source/drain regions.

6. The method of claim 1, further comprising forming the source/drain regions at least in part through segregated doping.

7. The method of claim 1, further comprising forming a metal silicide over the source/drain regions.

8. The method of claim 1, further comprising forming a metal layer over the source/drain regions.

9. A method for forming a semiconductor device, the method comprising:
   forming a conductive region over a substrate, the conductive region comprising a first region with a first lattice constant, a second region with a second lattice constant different from the first lattice constant, and a third region opposite the second region from the first region, the third region having the first lattice constant;
   forming an inter-layer dielectric over the conductive region;
   forming an opening through the inter-layer dielectric to expose at least three surfaces of the conductive region, the at least three surfaces forming an exposed conductive region; and
   filling the opening with a conductive material to form a contact with the exposed conductive region.

10. The method of claim 9, wherein the forming an opening includes exposing at least four surfaces of the conductive region.

11. The method of claim 9, wherein the forming a conductive region further comprises:
   providing a conductive layer over the substrate, the conductive layer having the second region;
   removing a first section and a second section of the conductive layer on opposing sides of the second region; and
   forming the first region and the third region.

12. The method of claim 9, further comprising stressing the second region.

13. The method of claim 12, wherein the inter-layer dielectric stresses the second region.

14. The method of claim 12, wherein the stressing the second region includes forming a contact etch stop layer over the conductive region prior to the forming the inter-layer dielectric.

15. The method of claim 9, further comprising forming silicide regions over at least a portion of the conductive region prior to the forming the inter-layer dielectric.

16. A method of forming a semiconductor device, the method comprising:
   forming a conductive fin over a substrate, the conductive fin comprising an upper surface and sidewalls, the sidewalls having a first height, the conductive fin also comprising a first section, a second section, and a third section interposed between the first section and the second section, the third section having a different conductivity than the first section and the second section;
   forming an inter-layer dielectric over the conductive fin;
   forming at least one aperture through the inter-layer dielectric to expose at least a portion of the upper surface and at least a portion of the sidewalls, the forming the at least one aperture only exposing a portion of the first height of the sidewalls; and
   filling the at least one aperture with a conductive material to form at least one contact to the conductive fin, the at least one contact being in physical connection with the upper surface and at least a portion of two or more of the sidewalls.

17. The method of claim 16, further comprising forming a contact etch stop layer over the conductive fin prior to forming an inter-layer dielectric, the contact etch stop layer imparting a stress to the third section.

18. The method of claim 16, wherein the forming the conductive fin further comprises:
   providing a conductive layer, the conductive layer comprising the third section;
   removing a first portion and a second portion of the conductive layer around the third section; and
   growing the first section and the second section adjacent to the third section.

19. The method of claim 18, wherein the growing the first section and the second section further comprises growing the first section and the second section to have a different lattice constant than the third section.

20. The method of claim 16, wherein the forming the at least one aperture comprises exposing at least four surfaces of the conductive fin.

* * * * *